United States Patent
Wang et al.

(10) Patent No.: US 11,850,594 B2
(45) Date of Patent: Dec. 26, 2023

(54) MICROPARTICLE MULTI-CHANNEL TIME-SHARING SEPARATION DEVICE AND METHOD BASED ON ARCUATE INTERDIGITAL TRANSDUCER

(71) Applicant: ZHEJIANG UNIVERSITY, Zhejiang (CN)

(72) Inventors: Yancheng Wang, Zhejiang (CN); Chengyao Xu, Zhejiang (CN); Deqing Mei, Zhejiang (CN); Chenyang Han, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 712 days.

(21) Appl. No.: 16/977,099

(22) PCT Filed: Jul. 12, 2019

(86) PCT No.: PCT/CN2019/095849
§ 371 (c)(1),
(2) Date: Sep. 1, 2020

(87) PCT Pub. No.: WO2020/191954
PCT Pub. Date: Oct. 1, 2020

(65) Prior Publication Data
US 2021/0060561 A1    Mar. 4, 2021

(30) Foreign Application Priority Data
Mar. 25, 2019    (CN) .......................... 201910226920.8

(51) Int. Cl.
*B01L 3/00*    (2006.01)
*B06B 1/02*    (2006.01)
(Continued)

(52) U.S. Cl.
CPC ..... *B01L 3/502761* (2013.01); *B01L 3/50273* (2013.01); *B01L 3/502707* (2013.01);
(Continued)

(58) Field of Classification Search
CPC ......... B01L 3/502761; B01L 3/502707; B01L 3/5027; B01L 2200/0652;
(Continued)

(56) References Cited

U.S. PATENT DOCUMENTS

2018/0214874 A1    8/2018   Koksal et al.
2019/0234902 A1*   8/2019   Lima, Jr. ............ G01N 33/5438
2020/0276579 A1*   9/2020   Huang .............. B01L 3/502761

FOREIGN PATENT DOCUMENTS

CN    107110854    8/2017
CN    208167024    11/2018
(Continued)

OTHER PUBLICATIONS

"International Search Report (Form PCT/ISA/210) of PCT/CN2019/095849," dated Nov. 28, 2019, pp. 1-4.

*Primary Examiner* — Brian J. Sines
(74) *Attorney, Agent, or Firm* — JCIP GLOBAL INC.

(57) ABSTRACT

The invention discloses microparticle multi-channel time-sharing separation device and method based on an arcuate interdigital transducer. An arcuate interdigitated electrode is connected to an output channel of a signal generator. The arcuate interdigitated electrode and a polydimethylsiloxane (PDMS) microfluidic channel are placed on a lithium niobate chip. The arcuate interdigitated electrode is mainly formed by an interdigitated electrode being asymmetrically bent from a straight line into an arcuate curve. Two electrode ends of the arcuate interdigitated electrodes are asymmetrically arranged with one end big and another end small. The PDMS microfluidic channel includes a main flow channel,
(Continued)

two inlet ends, and multiple outlet ends. The main flow channel is an approximately arcuate flow channel arranged around an outer side of the arcuate interdigitated electrode. Particles are patterned in a coverage section of surface acoustic waves to complete separation of microparticles.

6 Claims, 4 Drawing Sheets

(51) Int. Cl.
  *B06B 1/06* (2006.01)
  *H10N 30/87* (2023.01)
  *H10N 30/80* (2023.01)
  *H10N 30/853* (2023.01)
(52) U.S. Cl.
  CPC ...... *B01L 3/502715* (2013.01); *B06B 1/0284* (2013.01); *B06B 1/0644* (2013.01); *H10N 30/802* (2023.02); *H10N 30/8542* (2023.02); *H10N 30/87* (2023.02); *B01L 2200/0652* (2013.01); *B01L 2200/12* (2013.01); *B01L 2300/0645* (2013.01); *B01L 2300/08* (2013.01); *B01L 2300/123* (2013.01); *B01L 2400/0436* (2013.01); *B06B 2201/55* (2013.01); *B06B 2201/77* (2013.01)
(58) Field of Classification Search
  CPC ..... B01L 2300/0645; B01L 2400/0436; H10N 30/8542; H01N 30/802; H01N 30/87; B06B 1/0284; B06B 1/0644; B06B 2201/55
  See application file for complete search history.

(56) References Cited

FOREIGN PATENT DOCUMENTS

| | | |
|---|---|---|
| CN | 109212027 | 1/2019 |
| CN | 109865542 | 6/2019 |

\* cited by examiner

MICROPARTICLE MULTI-CHANNEL TIME-SHARING SEPARATION DEVICE AND METHOD BASED ON ARCUATE INTERDIGITAL TRANSDUCER

CROSS-REFERENCE TO RELATED APPLICATION

This application is a 371 of international application of PCT application serial no. PCT/CN2019/095849, filed on Jul. 12, 2019, which claims the priority benefit of China application no. 201910226920.8, filed on Mar. 25, 2019. The entirety of each of the above mentioned patent applications is hereby incorporated by reference herein and made a part of this specification.

BACKGROUND

Technical Field

The disclosure relates to a microparticle multi-channel time-sharing separation technology, and in particular to microparticle multi-channel time-sharing separation device and method based on an arcuate interdigital transducer.

Description of Related Art

Microfluidic chip is a scientific technology with the main feature of controlling a fluid in a micron-scale space. Microfluidic chips are mostly formed by microchannel network, with controllable fluids, so as to implement various functions in chemical and biological fields. Basic operation units such as sample preparation, reaction, separation, detection, etc. in biological, chemical, and medical analysis processes are integrated onto one micron-scale chip to automatically complete the entire analysis process. Due to the huge potential of the microfluidic chip in the fields of biology, chemistry, medicine, etc., the microfluidic chip has developed into a brand-new research field where the subjects of biology, chemistry, medicine, fluids, electronics, materials, machinery, etc. intersect.

Particle separation technology plays an important role in the fields of biology, chemistry, medical diagnosis, etc., and is one of the foundations of the microfluidic chip technology. Common particle separation techniques include centrifugal separation, magnetic separation, hydrodynamic separation, dielectrophoretic separation, etc. The centrifugal separation method separates lighter particles from heavier particles through rotating the sample in a rotating chamber, but the device is bulky and may damage the biological cell sample. The magnetic separation method applies an external magnetic field to the sample to complete the separation of particles, but the particles need to be pretreated with magnetic labels. The hydrodynamic method guides particles of different sizes to different flow channel outlets through designing asymmetrical obstacles in the flow channels, but the separation of different particles requires different designs of flow channel. The dielectrophoretic separation method separates particles with different charges or polarization characteristics through an external electric field, but there are requirements regarding the properties of the particles.

Acoustofluidic particle separation is a new particle separation technology emerged in recent years, which has the advantages of no labeling, high biocompatibility, easy integration, etc. The acoustofluidic particle separation technology can be divided into two categories: acoustofluidic particle separation based on bulk acoustic waves and acoustofluidic particle separation based on surface acoustic waves. Almost all types of particles and cells can be separated based on differences in shape, size, density, compressibility, etc. Existing methods for acoustofluidic particle separation mostly implement the patterning and separation of particles through applying a bulk acoustic wave field or a surface acoustic wave field to a certain fixed section of a flow channel. The existing methods for acoustofluidic particle separation cannot well implement time-sharing separation of particles for a hybrid particle flow having compositions that change with time.

SUMMARY

In order to solve the problems in the background art, the invention provides microparticle multi-channel time-sharing separation device and method based on an arcuate interdigital transducer utilizing the acoustic field induced by high-frequency surface acoustic waves. High-frequency ultrasonic surface acoustic waves form a traveling wave field in a polydimethylsiloxane (PDMS) flow channel. Based on the characteristic that the acoustic radiation force of microparticles in the traveling wave field of surface acoustic waves sharply increases with the increase of the diameter, the arrangement of particles with different diameters can be implemented to complete the separation. The objective of multi-channel separation of microparticles can be achieved by adjusting the frequency of the signal generator to generate surface acoustic waves in different directions to complete the arrangement and separation of microparticles in different flow channel sections.

The technical solutions adopted by the invention to solve the technical problems are as follows.

1. A microparticle multi-channel time-sharing separation device based on an arcuate interdigital transducer.

The device includes a lithium niobate chip, an arcuate interdigitated electrode and a PDMS microfluidic channel. The arcuate interdigitated electrode is arranged on a lithium niobate chip. The arcuate interdigitated electrode and the lithium niobate chip form a surface acoustic wave arcuate interdigital transducer. The arcuate interdigitated electrode is connected to an output channel of a signal generator. The PDMS microfluidic channel is arranged on the lithium niobate chip on a side of the arcuate interdigitated electrode and is bonded to the lithium niobate chip through oxygen plasma bonding. The arcuate interdigitated electrode is mainly formed by an interdigitated electrode being asymmetrically bent from a straight line into an arcuate curve. Two electrode ends of the arcuate interdigitated electrode are asymmetrically arranged with one end big and another end small. The spacing between interdigitated electrodes (strip-shaped) of the arcuate interdigitated electrode at the same radial angle is the same and the spacing between the interdigitated electrodes (strip-shaped) from one end to another end at different radial angles increases progressively or decreases progressively. The PDMS microfluidic channel includes a main flow channel, two inlet ends, and a plurality of outlet ends. The two inlet ends are respectively a particle flow inlet and a sheath flow inlet, which are connected to an end of the main flow channel together. The particle flow inlet and the sheath flow inlet respectively let in a hybrid particle flow and a sheath flow. The hybrid particle flow contains microparticles of different sizes. The main flow channel is provided with 1 to 4 bifurcations between the middle part and another end, and each bifurcation is provided with 1 to 3 outlet ends.

The signal generator applies electrical signals to the arcuate interdigitated electrode. The arcuate interdigitated electrode serves as an surface acoustic wave source to emit surface acoustic waves to the PDMS microfluidic channel. The microparticles in the PDMS microfluidic channel are dispersed and separated by the surface acoustic waves, thereby implementing time-sharing separation of the hybrid particle flow in the PDMS microfluidic channel.

The surface acoustic waves are excited radially outward at different radial angular positions of the arcuate interdigitated electrode through applying the electrical signals of different frequencies at different times.

The main flow channel of the PDMS microfluidic channel is an approximately arcuate flow channel arranged around the outer side of the arcuate interdigitated electrode.

The material of the arcuate interdigitated electrode is aluminum and the arcuate interdigitated electrode is formed on the lithium niobate chip through photolithography and physical vapor deposition.

The PDMS microfluidic channel is a polydimethylsiloxane microfluidic channel.

2. A microparticle multi-channel time-sharing separation method based on an arcuate interdigital transducer. The method includes the following steps.

(1) An surface acoustic wave arcuate interdigital transducer composed of a lithium niobate chip and an arcuate interdigitated electrode is constructed and a PDMS microfluidic channel of the specific shape is manufactured.

(2) The surface acoustic wave arcuate interdigital transducer is connected to an output channel of a signal generator. The signal generator is activated to apply electrical signals to two ends of the arcuate interdigitated electrode. The surface acoustic wave arcuate interdigital transducer generates surface acoustic waves on the lithium niobate chip to excite the PDMS microfluidic channel, so that a traveling wave field of surface acoustic waves is generated at the location where the PDMS microfluidic channel is excited to form a coverage section of traveling surface acoustic wave.

(3) A hybrid particle flow and a sheath flow are respectively let in from two inlets of the PDMS microfluidic channel. When flowing through the coverage section of traveling surface acoustic wave, microparticles are subjected to an acoustic radiation force of the surface acoustic waves. The acoustic radiation force sharply increases with an increase in the diameter of the microparticles, causing the microparticles to move at different distances in the width direction of the PDMS microfluidic channel to be dispersed. Separation is completed at the bifurcation of the PDMS microfluidic channel. At different times, the surface acoustic waves are excited outward at different circumferential angular positions of the arcuate interdigitated electrode through changing the frequency of the electrical signals output by the signal generator. The microparticles are dispersed and separated at the bifurcation of the PDMS microfluidic channel at the circumferential angular positions.

The beneficial effects of the invention are as follows.

(1) The invention generates the surface acoustic wave field at a designated section of the PDMS microfluidic channel using the characteristic that the arcuate interdigital transducer generates surface acoustic waves in different directions under different electrical signals to implement the multi-channel time-sharing separation of microparticles.

(2) The equipment used in the invention is simple and easy to operate. The arcuate interdigitated electrode is photoetched on the lithium niobate chip. The manufacturing process is mature.

(3) The invention has the characteristics of easy integration with other microfluidic technologies and low energy consumption.

DETAILED DESCRIPTION OF DISCLOSED EMBODIMENTS

The invention will be further described below with reference to the drawings and embodiments, but the embodiments of the invention are not limited thereto.

Figure 1:
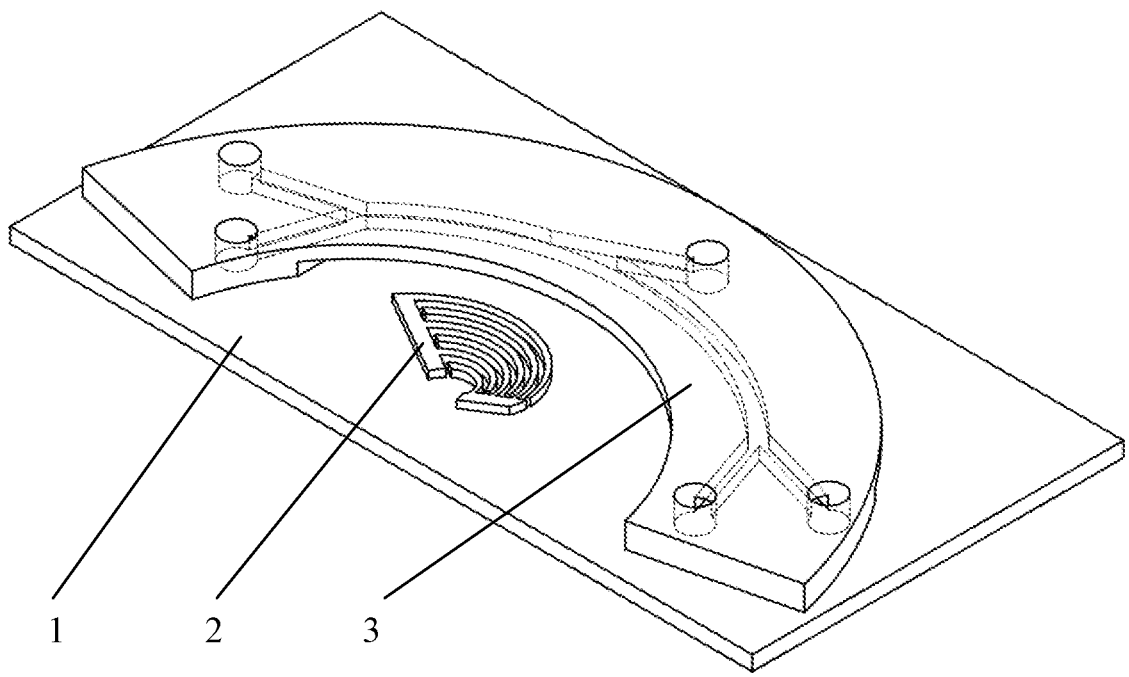
FIG. 1 is a schematic view of the device structure according to the invention.

As shown in FIG. 1, the time-sharing multi-channel separation device according to the embodiment includes a lithium niobate chip 1, an arcuate interdigitated electrode 2, and a polydimethylsiloxane (PDMS) microfluidic channel 3. The arcuate interdigitated electrode 2 is arranged on the lithium niobate chip 1. The arcuate interdigitated electrode 2 and the lithium niobate chip 1 form a surface acoustic wave arcuate interdigital transducer. The arcuate interdigitated electrode 2 is connected to an output channel of a signal generator. The PDMS microfluidic channel 3 is arranged on the lithium niobate chip 1 on a side of the arcuate interdigitated electrode 2 and is bonded to the lithium niobate chip 1 through oxygen plasma bonding.

Figure 2:
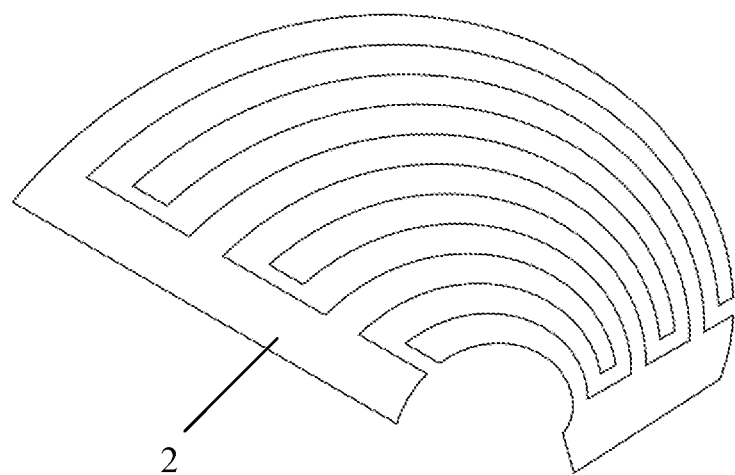
FIG. 2 is a top view of an arcuate interdigitated electrode according to the invention.

As shown in FIG. 2, the arcuate interdigitated electrode 2 is mainly formed by a normal conventional interdigitated electrode being asymmetrically bent from a straight line into an arcuate curve. Two electrode ends of the arcuate interdigitated electrode 2 are asymmetrically arranged with one end big and another end small. The spacing between interdigitated electrodes (strip-shaped) of the arcuate interdigitated electrode 2 at the same radial angle is the same. The spacing changes at different radial angles. The spacing between interdigitated electrodes (strip-shaped) from one end to another end increases progressively or decreases progressively.

Figure 3:
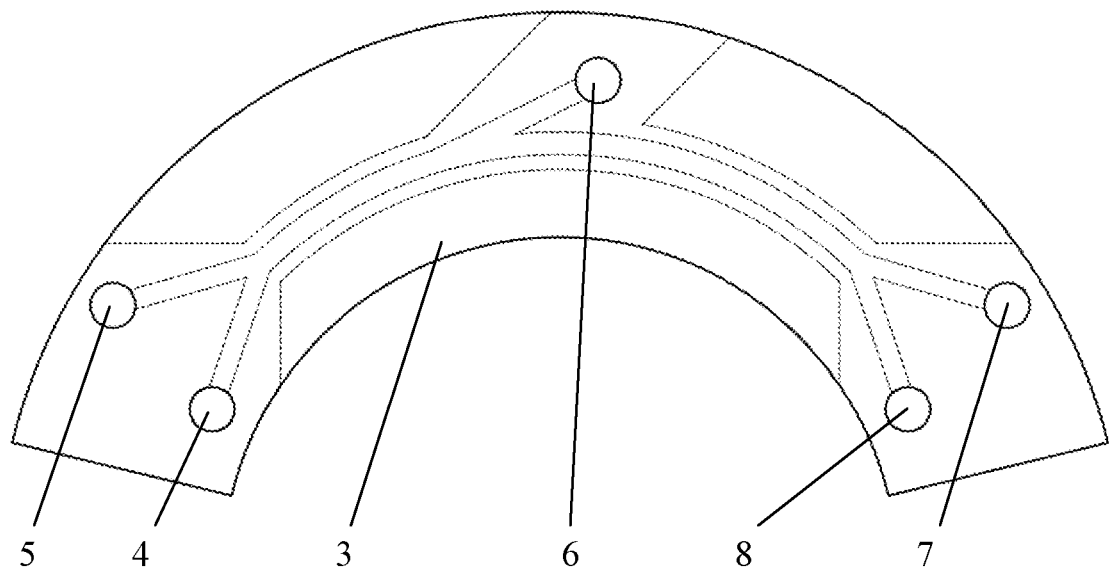
FIG. 3 is a top view of a polydimethylsiloxane (PDMS) microfluidic channel according to the invention.

As shown in FIG. 3, the PDMS microfluidic channel 3 includes a main flow channel, two inlet ends, and a plurality of outlet ends. The main flow channel is approximately arcuate and is arranged around the outer side of the arcuate interdigitated electrode 2. The two inlet ends are respectively a particle flow inlet 4 and a sheath flow inlet 5, which are connected to an end of the main flow channel together. The particle flow inlet 4 and the sheath flow inlet 5 respectively let in a hybrid particle flow 9 and a sheath flow 10. The hybrid particle flow 9 contains microparticles of different sizes. The main flow channel is provided with 1 to 4 bifurcations between a middle part and another end, and each bifurcation is provided with 1 to 3 outlet ends.

The specific implementation is as shown in FIG. 1 and FIG. 3. The main flow channel is provided with 1 bifurcation in the middle part and the bifurcation is provided with 1 outlet end, which is the no. 1 outlet 6. At another end, 1 bifurcation is provided and the bifurcation is provided with 2 outlet ends, which are the no. 2 outlet 7 and the no. 3 outlet 8.

The material of the arcuate interdigitated electrode 2 is aluminum with a thickness of 200 nm. The arcuate interdigitated electrode 2 is formed on the lithium niobate chip 1 through photolithography and physical vapor deposition. The PDMS microfluidic channel is a polydimethylsiloxane microfluidic channel.

The embodiments of the invention and the specific implementation process are as follows.

(1) The arcuate interdigitated electrode 2 and the PDMS microfluidic channel 1 are first prepared. A layer of positive photoresist is spin-coated on the lithium niobate (LiNO$_3$) chip 1. Mask exposure is performed using a pre-made mask plate. Subsequently, the exposed photoresist is washed away to obtain a non-resistive region on the chip with the same shape as the metal electrode. A layer of aluminum metal with a thickness of 200 nm is deposited on the lithium niobate chip using physical vapor deposition after photolithography. Then, the remaining photoresist and excess metal film is dissolved using acetone to obtain the arcuate interdigitated electrode 2 as shown in FIG. 2.

The PDMS microfluidic channel 3 is obtained using soft lithography method to make SU-8 mold and heating to cure after pouring PDMS. The shape thereof is shown in FIG. 3. The PDMS microfluidic channel 3 is bonded to a location opposite to the arcuate interdigitated electrode 2 on the lithium niobate chip 1 through oxygen plasma bonding.

Figure 4:
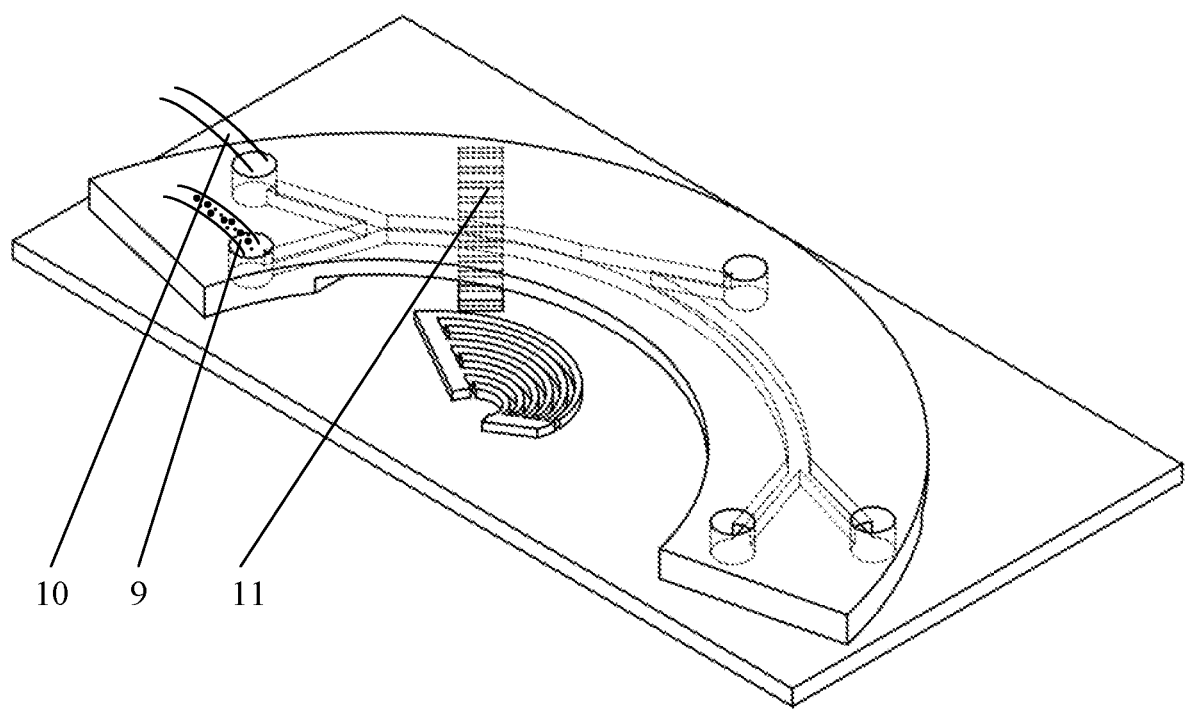
FIG. 4 is a schematic view of activating the device under an electric signal of frequency f1 according to an embodiment.

(2) The separation device is placed on a horizontal working stand. The arcuate interdigital transducer is connected to the output channel of the signal generator. The signal generator is activated and the electrical signal of frequency f1 is output. As shown in FIG. 4, the arcuate interdigital transducer generates a surface acoustic wave (f1) 11 on a piezoelectric chip and generates a traveling wave field of surface acoustic waves at a specific location of the PDMS microfluidic channel 3.

Figure 5:
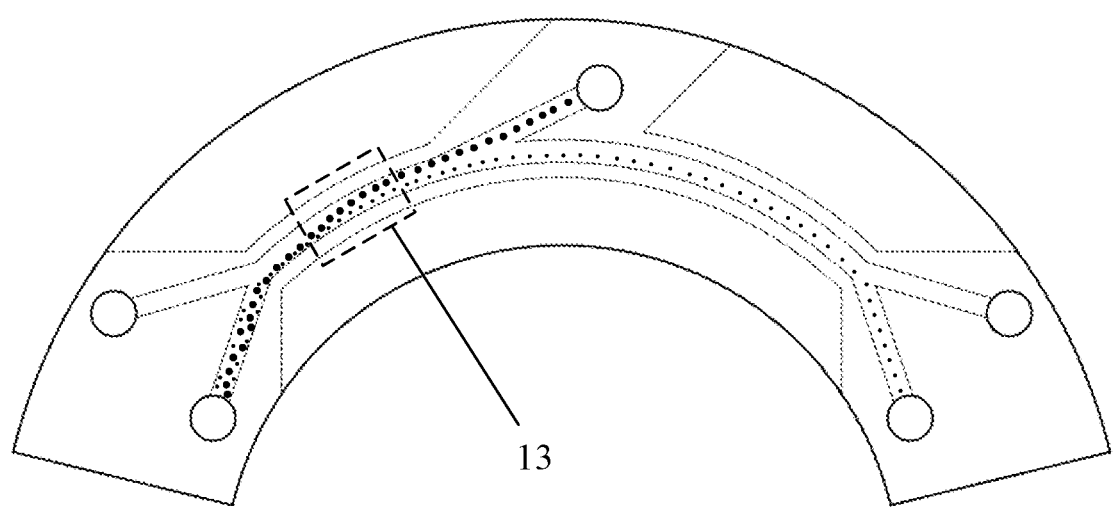
FIG. 5 is a schematic view of arranging and separating particles under an electrical signal of frequency f1 according to an embodiment.

(3) The hybrid particle flow 9 and the sheath flow 10 are respectively let in from the particle flow inlet 4 and the sheath flow inlet 5 of the PDMS microfluidic channel 3, and the flow rates thereof are respectively 25 μL/h and 75 μL/h. As shown in FIG. 5, when flowing through the coverage section of surface acoustic wave (f1) 13, particles of different diameters are subjected to different magnitudes of acoustic radiation forces, so as to move at different distances in the width direction of the flow channel to complete the arrangement. The particles with a diameter of 3 μm at the subsequent bifurcation flow to the no. 3 outlet 8 and the particles with a diameter of 10 μm flow to the no. 1 outlet 6 to complete the separation.

Figure 6:
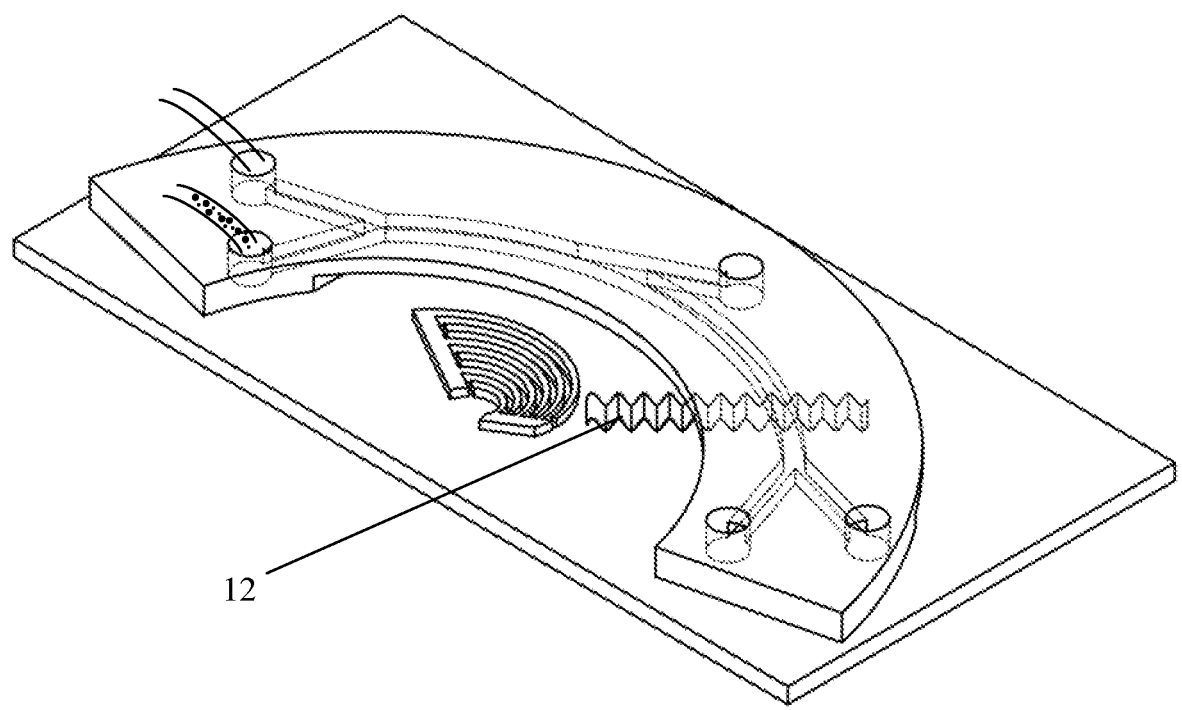
FIG. 6 is a schematic view of activating a device under an electric signal of frequency f2 according to an embodiment.
Figure 7:
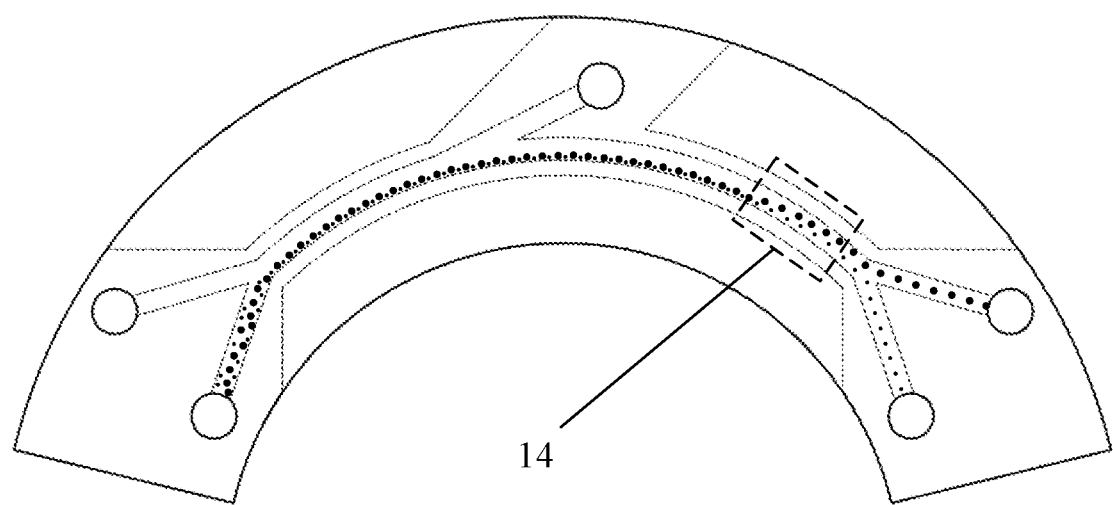
FIG. 7 is a schematic view of arranging and separating particles under an electric signal of frequency f2 according to an embodiment.

(4) The frequency of the output signal of the signal generator is changed to f2. As shown in FIG. 6, the arcuate interdigital transducer excites a surface acoustic wave (f2) 12 at another angle. As shown in FIG. 7, the particles in the hybrid particle flow is arranged in the coverage section of surface acoustic wave (f2) 14. The particles with a diameter of 3 μm at the subsequent bifurcation flow to the no. 3 outlet 8 and the particles with a diameter of 10 μm flow to the no. 2 outlet 7 to complete the separation.

It can be seen from the embodiments that the invention implements the multi-channel time-sharing separation of microparticles, which is easy to operate, has low energy consumption, and has a wide application range.

What is claimed is:

1. A microparticle multi-channel time-sharing separation device based on an arcuate interdigital transducer, comprising: a lithium niobate chip, an arcuate interdigitated electrode, and a polydimethylsiloxane microfluidic channel, wherein the arcuate interdigitated electrode is arranged on the lithium niobate chip, the arcuate interdigitated electrode and the lithium niobate chip form a surface acoustic wave arcuate interdigital transducer, the arcuate interdigitated electrode is connected to an output channel of a signal generator, and the polydimethylsiloxane microfluidic channel is arranged on the lithium niobate chip on a side of the arcuate interdigitated electrode and is bonded to the lithium niobate chip through oxygen plasma bonding; the arcuate interdigitated electrode is mainly formed by an interdigitated electrode being asymmetrically bent from a straight line into an arcuate curve, two electrode ends of the arcuate interdigitated electrode are asymmetrically arranged with one of the two electrode ends which is big and another one of the two electrode ends which is small, spacing between strip-shaped interdigitated electrodes of the arcuate interdigitated electrode at a same radial angle is the same, and spacing between the strip-shaped interdigitated electrodes from the one of the two electrode ends to the another one of the two electrode ends gradually increases progressively or decreases progressively; the polydimethylsiloxane microfluidic channel comprises a main flow channel, two inlet ends, and a plurality of outlet ends, the two inlet ends are respectively a particle flow inlet and a sheath flow inlet which are connected to an end of the main flow channel together, the particle flow inlet and the sheath flow inlet respectively let in a hybrid particle flow and a sheath flow, the hybrid particle flow comprises microparticles of different sizes, the main flow channel is provided with 1 to 4 bifurcations between a middle part and another end, and each of the bifurcations is provided with 1 to 3 outlet ends of the outlet ends.

2. A microparticle multi-channel time-sharing separation device based on an arcuate interdigital transducer according to claim 1, wherein the signal generator applies electrical signals to the arcuate interdigitated electrode, the arcuate interdigitated electrode serves as a surface acoustic wave source to emit surface acoustic waves to the polydimethylsiloxane microfluidic channel, the microparticles in the PDMS microfluidic channel are dispersed and separated by the surface acoustic waves, thereby implementing time-sharing separation of the hybrid particle flow in the polydimethylsiloxane microfluidic channel.

3. A microparticle multi-channel time-sharing separation device based on an arcuate interdigital transducer according to claim 2, wherein the surface acoustic waves are excited radially outward at different radial angular positions of the arcuate interdigitated electrode through applying electrical signals of different frequencies at different times.

4. A microparticle multi-channel time-sharing separation device based on an arcuate interdigital transducer according to claim 1, wherein the main flow channel of the polydimethylsiloxane microfluidic channel is an arcuate flow channel arranged around an outer side of the arcuate interdigitated electrode.

5. A microparticle multi-channel time-sharing separation device based on an arcuate interdigital transducer according to claim 1, wherein a material of the arcuate interdigitated electrode is aluminum and the arcuate interdigitated electrode is formed on the lithium niobate chip through photolithography and physical vapor deposition.

6. A microparticle multi-channel time-sharing separation method based on an arcuate interdigital transducer applied to a device according to claim 1, the method comprising:
constructing the surface acoustic wave arcuate interdigital transducer composed of the lithium niobate chip and the arcuate interdigitated electrode, and manufacturing the polydimethylsiloxane microfluidic channel of a specific shape;
connecting the surface acoustic wave arcuate interdigital transducer to the output channel of the signal generator, activating the signal generator to apply the electrical signals to the arcuate interdigitated electrode, and generating surface acoustic waves on the lithium niobate chip to excite the polydimethylsiloxane microfluidic channel, so that an acoustic field of the travelling surface acoustic waves is generated at a location where the polydimethylsiloxane microfluidic channel is excited to form a coverage section of traveling surface acoustic wave; and
respectively letting in the hybrid particle flow and the sheath flow from the polydimethylsiloxane microfluidic channel, wherein the microparticles are subjected to an acoustic radiation force of the surface acoustic waves when flowing through the coverage section of travelling surface acoustic wave, the acoustic radiation force increases with an increase of a diameter of the microparticles, causing the microparticles to move differently in a width direction of the polydimethylsiloxane microfluidic channel to be dispersed, and separation is completed at the bifurcations of the polydimethylsiloxane microfluidic channel; and exciting the surface acoustic waves outward at different circumferential angular positions of the arcuate interdigitated electrode at different times through changing a frequency of the electrical signals output by the signal generator, wherein the microparticles are dispersed and separated at the bifurcations of the polydimethylsiloxane microfluidic channel at the circumferential angular positions.

\* \* \* \* \*